(12) United States Patent
Hochstein et al.

(10) Patent No.: US 6,582,100 B1
(45) Date of Patent: Jun. 24, 2003

(54) LED MOUNTING SYSTEM

(75) Inventors: Peter A. Hochstein, Troy, MI (US); Gregg K. Reber, Clinton Township, MI (US)

(73) Assignee: Relume Corporation, Troy, MI (US)

( * ) Notice: Subject to any disclaimer, the term of this patent is extended or adjusted under 35 U.S.C. 154(b) by 0 days.

(21) Appl. No.: 09/634,909

(22) Filed: Aug. 9, 2000

(51) Int. Cl.$^7$ ................................................ F21V 29/00
(52) U.S. Cl. ........................................ 362/294; 362/800
(58) Field of Search ................................ 362/226, 234, 362/249, 294, 382, 396, 800

(56) References Cited

U.S. PATENT DOCUMENTS

| | | | |
|---|---|---|---|
| 4,959,761 A | 9/1990 | Critelli et al. | 362/226 |
| 5,186,535 A | 2/1993 | Yokoyama | 362/226 |
| 5,264,998 A | 11/1993 | Bax | 362/226 |
| 5,440,468 A | 8/1995 | Savage, Jr. | 362/226 |
| 5,513,082 A | 4/1996 | Asano | 362/226 |
| 5,782,555 A | 7/1998 | Hochstein | 362/373 |
| 5,785,418 A | 7/1998 | Hochstein | 362/373 |
| 5,857,767 A | 1/1999 | Hochstein | 362/294 |
| 5,975,715 A | 11/1999 | Bauder | 362/226 |
| 5,984,488 A | * 11/1999 | Tung | 362/800 |
| 6,045,240 A | 4/2000 | Hochstein | 362/294 |
| 6,048,082 A | * 4/2000 | Washimoto | 362/800 |

* cited by examiner

Primary Examiner—Y. My Quach-Lee
(74) Attorney, Agent, or Firm—Howard & Howard

(57) ABSTRACT

An electrically driven light emitting diode (LED) assembly and the method of assembling same. The assembly includes an electrically and thermally conductive heat dissipater (10) sandwiched under an electrically insulating layer (12) with circuit traces (14) disposed over the insulating layer (12) to prevent electrical conduction between the traces (14) and the heat dissipater (10). A plurality of light emitting diodes (20) have electrical leads (22) extending laterally from opposite extremities of each LED (20) to overlie the traces (14) for electrical contact with the traces (14) for powering the LEDs (20). An independent and generally U-shaped holding device (24, 26, 28, 30 and 32), as viewed in cross section, defines a base overlying the LED (20) and a pair of legs (36, 136) depending therefrom and transversely to the electrical leads (22) between the LED (20) and the heat dissipater (10). The base defines a hole (38) and the LED (20) protrudes (39) through the hole (38) to emit light. The insulating layer (12) includes a void (40) surrounding each LED (20) and the legs (36, 136) of each associated holding device (24, 26, 28, 30 and 32) and each holding device (24, 26, 28, 30 and 32) includes a tensioning portion (44 or 48) for applying a force urging the LED (20) through the void (40) and into thermal engagement with the heat dissipater (10) and the electrical leads (22) thereof into engagement with the traces (14). The tensioning portion may comprise barbs (44) on the legs (36, 136) and/or undulations (48) in the legs (36, 136).

47 Claims, 3 Drawing Sheets

LED MOUNTING SYSTEM

BACKGROUND OF THE INVENTION

1. Field of the Invention

The subject invention relates to a method of mounting a light emitting diode to a substrate to be connected to a circuit to be electrically driven.

2. Description of the Prior Art

The electrically driven light emitting diode (LED) assemblies of the prior art typically include an electrically and thermally conductive heat dissipater or heat sink sandwiched with an electrically insulating circuit board. A plurality of spaced lengths of circuit traces is disposed over the insulative circuit board to prevent electrical conduction between the traces and the heat sink. A plurality of light emitting diodes is mounted on the circuit board and have electrical leads for electrical contact with the traces for powering the LEDs.

An example of such a prior art assembly is disclosed in U.S. Pat. No. 5,857,767 in the name of the inventor Peter A. Hochstein named herein. In that assembly, an insulating coating is disposed over an aluminum heat sink with circuit traces on the insulating layer and the leads of the LEDs are adhesively secured to the circuit traces to hold the LEDs in position. In other U.S. Pat. Nos. 6,045,240; 5,785,422 and 5,782,555, all in the name of Peter A. Hochstein, the lateral extending leads of the LEDs are secured to the circuit traces by soldering or an adhesive. Other methods for securing lamps to a circuit board include using metallic terminals that are spring biased into a retaining position with the circuit board, as disclosed in U.S. Pat. No. 5,513,082 to Asano.

Current practice is also exemplified by the Hewlett-Packard 'Barracuda' (HPWLB x 01) LEDs and the HPWL-MDXX family of LED arrays. As shown in the pertinent H. P. data sheets for this device, eighteen individual 'Barracuda' LEDs are mounted onto a metal core circuit board by adhesive means. The prior art methods are costly and difficult to implement in production, as each LED attachment must be done separately. Furthermore, the adhesive attachment of the heat sinked LEDs to a circuit board, rather than to the metallic heat dissipater, is far from optimal. This is because virtually all the advanced high performance LEDs incorporate some form of low thermal resistance path for heat rejection from the LED die. The junction temperature of the die depends not only on the thermal impedance of the LED lead frame or the integral heat sink, but also on the thermal resistance of the LED heat sink—heat dissipater interface and the thermal resistance of the dissipater itself.

Electronic components that generate heat are often attached to heat dissipaters using rivets, screws and spring clips. Examples of clips are disclosed in U.S. Pat. No. 4,959,761 to Critell et al, U.S. Pat. No. 5,186,535 to Yokoyama, U.S. Pat. No. 5,264,998 to Bax and U.S. Pat. No. 5,440,468 to Savage, Jr. In order to enhance thermal conduction at the interface of the component and the heat dissipater, materials are often sandwiched between the component and the heat dissipater. A variety of filled or unfilled greases, gels or viscoelastic materials can reduce the thermal impedance of the interface (joint) in order to maximize heat transfer. Microscopic gaps (typically air) between the hot component and the heat dissipater interfere with the efficient transfer of heat to the sink. Materials with thermal conductivities significantly higher than air fill the voids and can markedly improve the thermal performance of the interface. However, it has been shown that optimal heat transfer is not achieved unless a given contact force is maintained between the hot component and the heat dissipater.

In conventional electronic practice where heated components are often clamped to heat sinks with screws and insulating washers, it is common to note a decrease in heat transfer efficacy over time. This loss of heat transfer is particularly apparent if the devices are operated at higher temperature (in excess of 85° C.) and if plastic insulators are used in the fastener chain. Long term creep or plastic deformation of the attachment means may reduce the original clamping force to a fraction of the original value, thereby compromising heat flow across the mounting interface, which may lead to thermally induced failure.

Adhesive attachment systems are generally more resistant to high temperature operation, but sometimes exhibit detachment due to repeated temperature cycling. The relatively large differences in thermal expansion coefficients of plastics, epoxies and metals can give rise to substantial stresses at the attachment region. These stresses may exceed the strength of the adhesive and may eventually result in joint failure.

The advent of very high performance light emitting diodes (LEDs) with integral heat sinks require special mounting of these devices in order to achieve the desired heat rejection from the LED. In order to utilize the inherent low thermal resistance that is available in this newer generation of high performance LEDs, special attention must be given to the attachment of these LEDs to the heat dissipater. Such attachment must obviously include means to secure a very low thermal impedance interface between the LED heat sink and the heat dissipater to which it is connected.

SUMMARY OF THE INVENTION AND ADVANTAGES

The subject invention, therefore, provides a method of assembling an electrically driven light emitting diode (LED) having electrical leads in electrical contact with circuit traces that are disposed in predetermined spaced lengths over an electrically insulating layer. The method is characterized by mechanically holding the LED in a predetermined position on the insulating layer with the electrical leads thereof in electrical engagement with the traces.

The resulting electrically driven light emitting diode (LED) assembly is, therefore, characterized by an independent holding device mechanically holding each of the LEDs in a predetermined position on the insulating layer with the electrical leads thereof in electrical engagement with the traces.

The present invention solves the problems associated with the prior art retention systems by employing an independent holding device for mounting each LED in position to most effectively connect the leads thereof to the circuit and to transfer heat to the heat dissipater.

BRIEF DESCRIPTION OF THE DRAWINGS

Other advantages of the present invention will be readily appreciated, as the same becomes better understood by reference to the following detailed description when considered in connection with the accompanying drawings wherein.

DETAILED DESCRIPTION OF THE PREFERRED EMBODIMENTS

Figure 1:
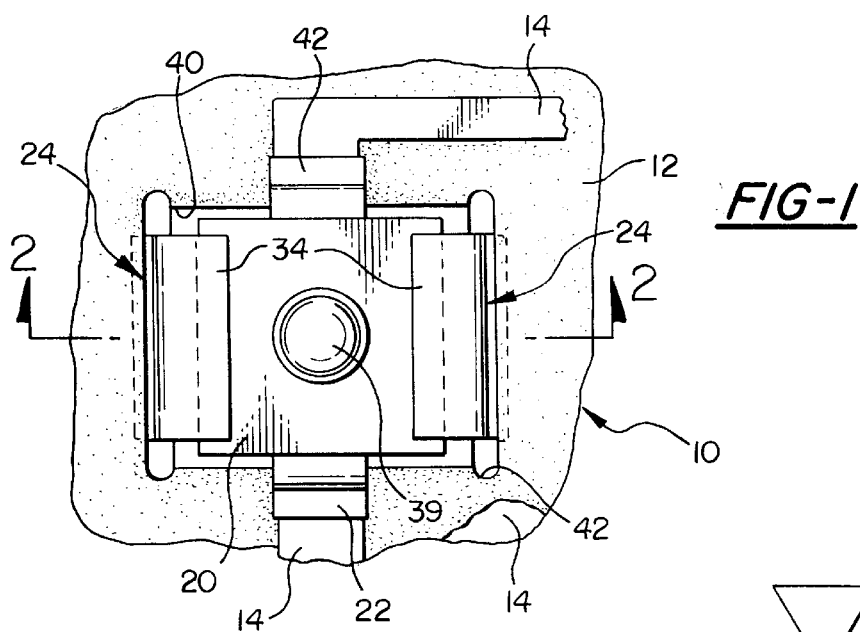
FIG. 1 is plan view of a first embodiment of the subject invention.
Figure 2:
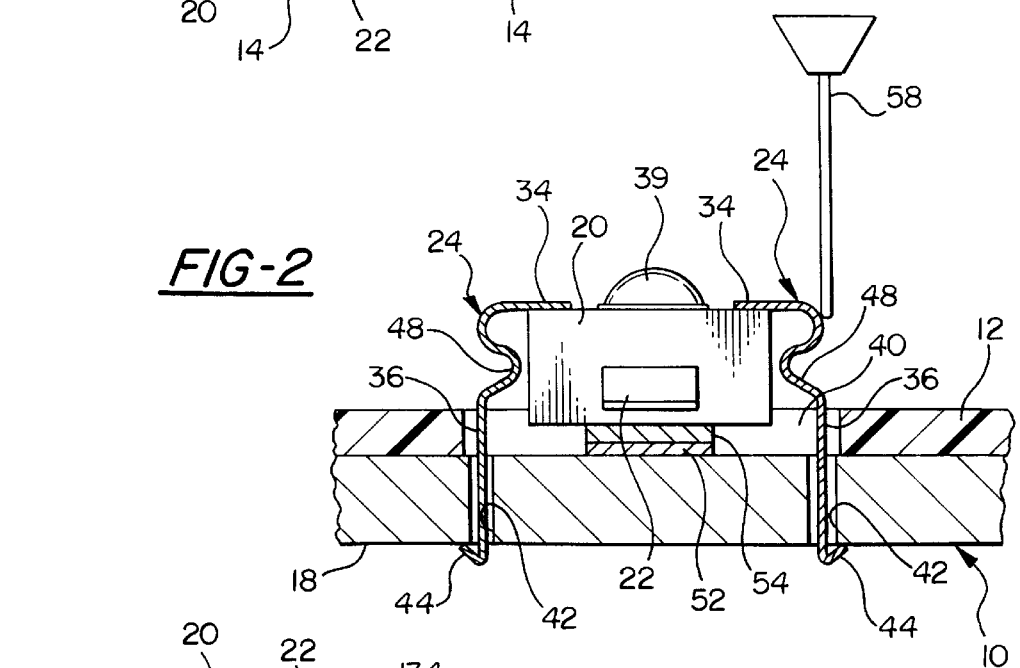
FIG. 2 is a fragmentary cross sectional view taken along line 2—2 of FIG. 1.
Figure 3:
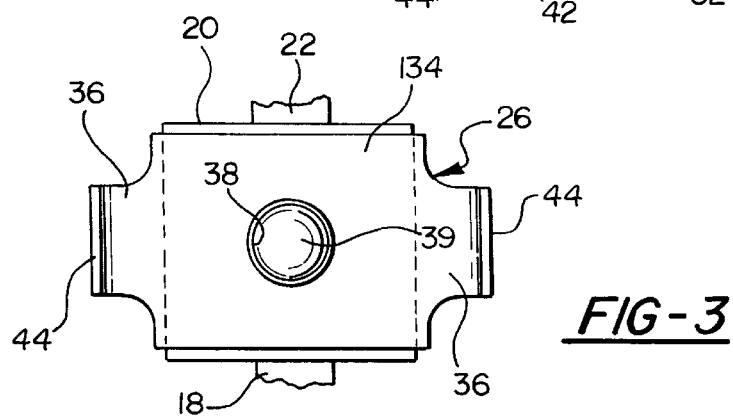
FIG. 3 is a plan view similar to FIG. 1 but showing the holding device in one integral piece instead of two pieces as in FIGS. 1 and 2.
Figure 4:
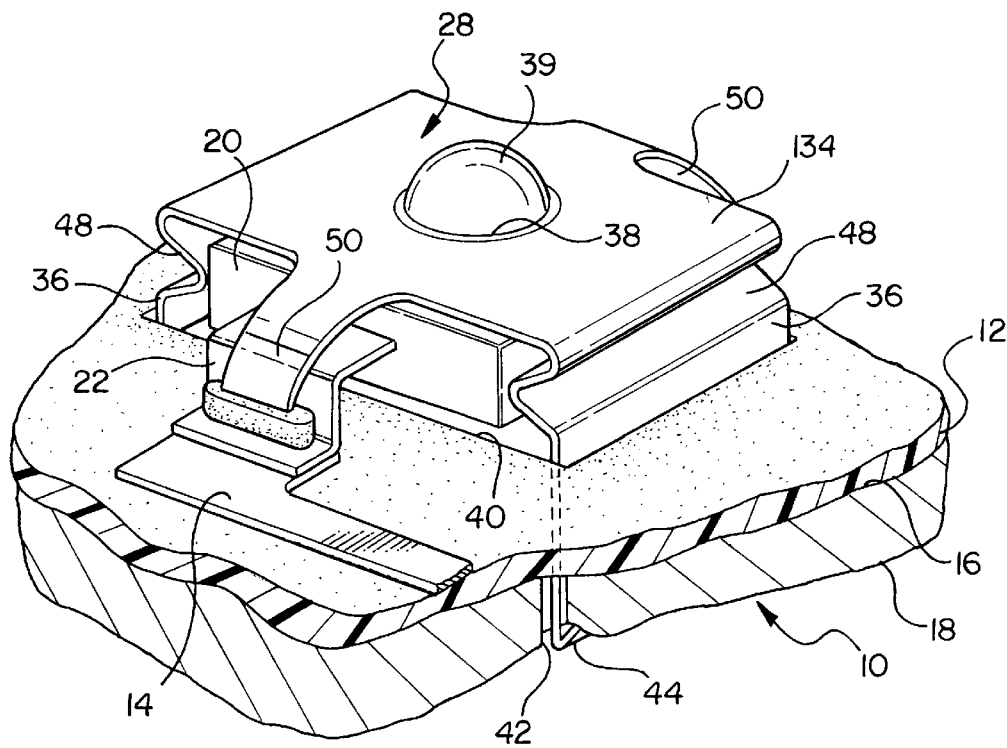
FIG. 4 is a perspective view of an alternative embodiment that includes tensioning portions defined by spring arms.
Figure 5:
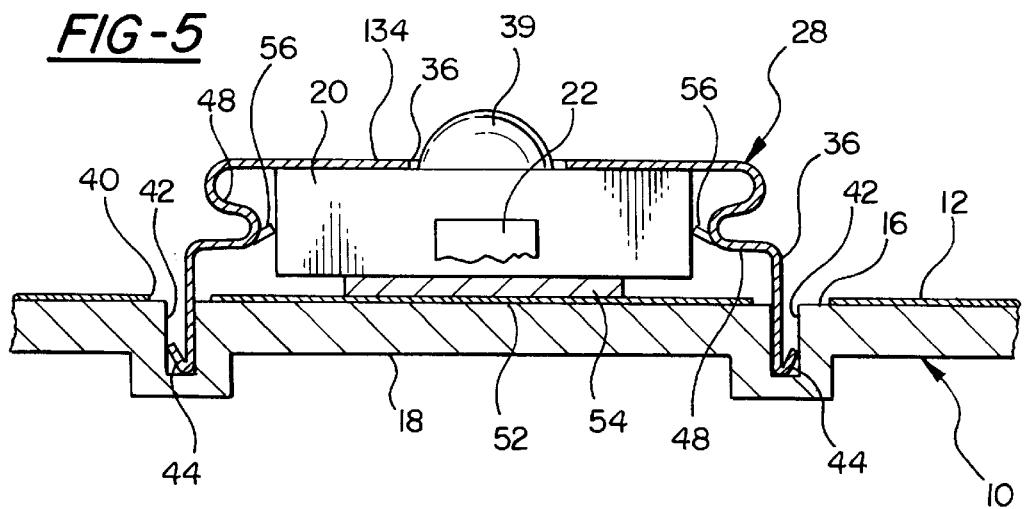
FIG. 5 is a cross sectional view showing a modified connection of the device of FIG. 4.
Figure 6:
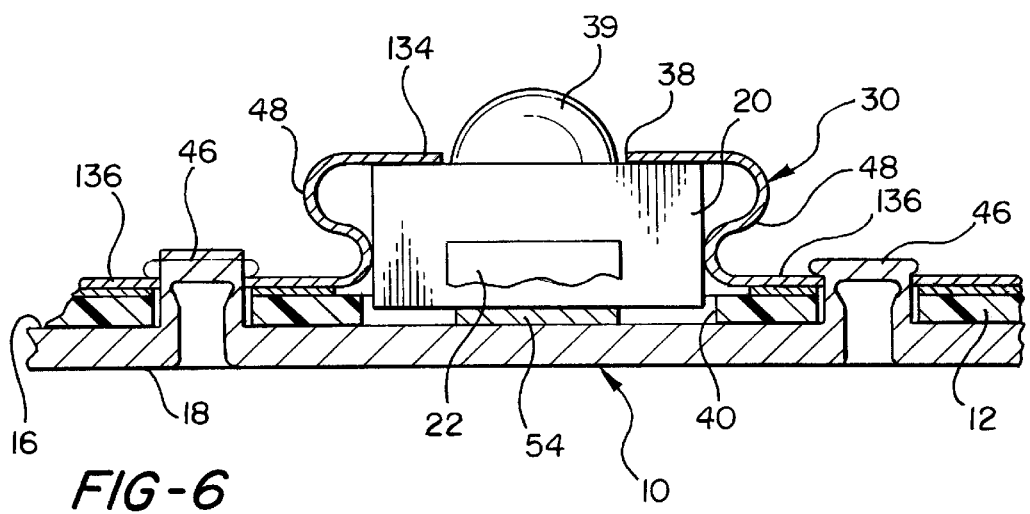
FIG. 6 is a cross sectional view similar to FIG. 5 but showing another modified connection of the device.
Figure 7:
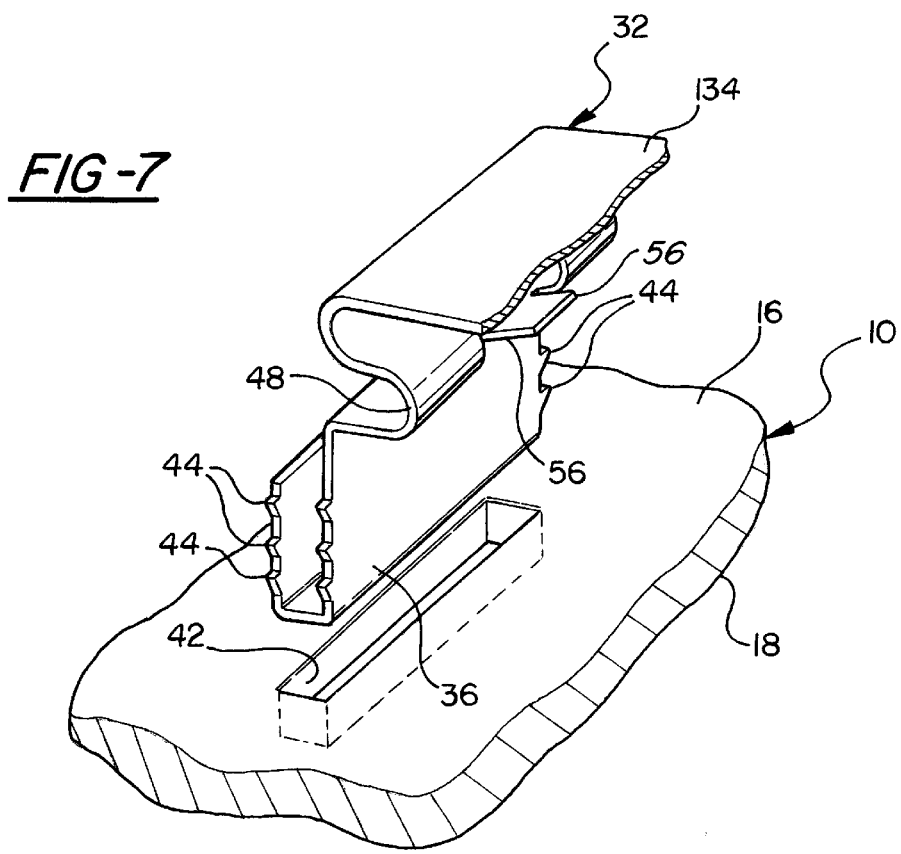
FIG. 7 is a fragmentary perspective view of yet another modified connection of the device.

Referring to the Figures, wherein an electrically driven light emitting diode (LED) assembly constructed in accordance with the subject invention is shown in a first embodiment in FIGS. 1 and 2, a second embodiment in FIG. 3, a third embodiment in FIGS. 4 and 5, a fourth embodiment in FIGS. 6, and a fifth embodiment in FIG. 7. However, like or corresponding components will be referred to with like numerals throughout the several views and embodiments.

In all cases, the assembly includes an electrically and thermally conductive heat dissipater or master heat sink, generally indicated at 10. The heat dissipater 10 is metallic, such as aluminum.

An electrically insulating layer 12 is disposed over the heat dissipater 10 and circuit traces 14 are disposed in predetermined spaced lengths over the layer 12 to prevent electrical conduction between the traces 14 and the heat dissipater 10. In all embodiments except FIG. 5, the insulating layer 12 consists of a semi-rigid and/or fibrous circuit board of the type well known in the art. In FIG. 5, the insulating layer is a coating or film of less than one thousand microns in thickness. The heat dissipater 10 has an upper surface 16 and a lower 18 and a surface layer 12 may be formed on the upper surface 16 by anodizing an aluminum heat dissipater 10 to form an aluminum oxide film or layer. The insulating layer 12 and the heat dissipater 10 are overlayed one another to define a substrate. A similiar substrate is disclosed in the aforesaid U.S. Pat. No. 5,857, 767.

The assembly includes a plurality of light emitting diodes 20 and each LED 20 has electrical leads 22 for electrical contact with the traces 14 for powering the respective LEDs 20. In the preferred mode, the electrical leads 22 extend laterally or horizontally in opposite directions from opposite extremities of the LED 20 and overlie the traces 14. It is also possible, to use a single lead LED where the heat sink 54 is one of the electrical connections while the other lead constitutes the second electrical connection to a trace.

The assembly is characterized by an independent holding device 24, 26, 28, 30 or 32 for mechanically holding each of the LEDs 20 in a predetermined position on the insulating layer 12 with the electrical leads 22 thereof overlying and in electrical engagement with the traces 14. Each device 24, 26, 28, 30 and 32 includes a holding portion for holding the LED and a connecting portion mechanically or reactively connected to the heat dissipater 10 and reacting between the LED 20 and the heat dissipater 10 to urge at least a portion of the LED 20 into thermal engagement with the heat dissipater 10. As is well known in the art, a mechanical connection is one wherein there is a mechanical interface, overlapping, interlock, abutment, or the like, without a bonding between the mechanically connected components, although the connection may alternatively consist of an adhesive between the holding device and the heat dissipater. The embodiment of FIGS. 1 and 2 includes two holding devices or elements 24 defining each holding device for each LED 20 with each element 24 presenting an inwardly directed flange 34 to define the holding portion overlying the top of the LED 20 and an integral leg 36 defining the connecting portion. The embodiments of FIGS. 3 through 7 differ by connecting or forming the holding portions 34 of FIGS. 1 and 2 into an integral or singular flange or base 134. Each of the holding devices 26, 28, 30 and 32 of FIGS. 3–7 is generally U-shaped as viewed in cross section to define the base 134 overlying the LED 20 and a pair of legs 36, 136 depending from the base 134 to define a pair of the connecting portions extending in parallel and spaced relationship to one another.

The base 134 defines a hole 38 and a light emitting protrusion 39 of the LED protrudes through the hole 38 to emit light. The base 134 is generally square and the legs 36 and 136 depend in a strip-like fashion with edges from the base 134. In the case of FIGS. 1 and 2, the hole is defined by the space between the adjacent holding portions 34. The insulating layer 12 includes a void 40 surrounding each LED and the legs 36 of each associated holding device 24, 26, 28, 30 and 32.

The heat dissipater 10 presents at least one opening and preferably a pair of opening 42 for each LED 20 and the connecting portion 36 extends into the opening 42 for mechanical interlocking engagement with the heat dissipater 10. Each connecting portion 36 includes a barb 44 in gripping engagement with the heat dissipater 10. More specifically, the opening 42 in the embodiments and variations in all of the FIGS. 1–4 extends completely through the dissipater 10 and the barb 44 engages the lower surface 18 of the dissipater 10. In the embodiments of FIGS. 5 and 7, the opening 42 may not extend completely through the dissipater 10; in which case, the barbs 44 engage the ends of the openings 42 in the dissipater 10. The only difference being that the barbs 44 in FIGS. 1–5 extend laterally from or transversely to the legs 36 whereas the barbs 44 in FIG. 7 extend parallel or from the edges of the legs 36. In the embodiment of FIG. 5, the opening 42 extends partially into the dissipater 10 and the barb 44 engages the opening 42 between the upper 16 and lower 18 surfaces. In the variations of FIG. 5 or FIG. 7, the barbs 44 on the holding device 24, 26, 28 or 32 can engage a closed recess or opening 42 in the heat dissipater 10. Such a holding device 24, 26, 28 or 32 will permit 'plug & play' fabrication of LED 20 assemblies without soldering. The sealed nature of the recessed sockets is, of course, advantageous as it precludes the infiltration of dust, moisture and/or corrosive agents. In the embodiment of FIG. 6, the heat dissipater 10 presents at least one projection 46 that extend through horizontally extending connecting portions or legs 136 of the holding device 30 for retaining the connecting portion 136 and are peened or coined over (like a rivet) and to mechanically interlock the legs 136 with the heat dissipater 10. The holding device 30 of FIG. 6 is also designed to apply an essentially constant holding force to the LED 20, keeping it in intimate contact with a heat dissipater 10, but without the need for mounting holes in the heat dissipater 10. In some cases the heat dissipater 10 forms part of the LED 20 assembly enclosure, and as such must provide a water-dust tight package. The retaining holding device 30 of FIG. 6, may be anchored to the heat dissipater 10 (plate) by upsetting (coining) raised areas or projections 46 on the formed metallic plate preferentially of aluminum or copper. Naturally, the electrical leads 22 of any spring tensioned LED 20 would be relatively compliant to accommodate any deflection of the LED 20 relative to the circuit it is electrically connected to. In most cases where the LED 20 electrical leads 22 are soldered or bonded to the circuit board, those connections would be made after the LED 20 retaining holding devices 24, 26, 28, 30 and 32 are installed. The correct mechanical alignment of the electrical leads 22 would thus be assured, and undue lead stress would not be a problem.

The holding device 24, 26, 28, 30 and 32 straddles the LED 20 to force it against the heat dissipater 10 and is configured to apply an essentially constant force against the heat dissipater 10. Accordingly, each of the devices 24, 26, 28, 30 and 32 includes a tensioning portion for applying a force urging the LED 20 into thermal engagement with the heat dissipater 10 and the electrical leads 22 thereof into engagement with the heat dissipater 10 and the electrical leads 22 thereof into engagement with the traces 14. In some instances, the tensioning portion may comprise the barbs 44 in spring-like engagement with the heat dissipater 10. When the holding devices 24, 26, 28, 30 and 32 are inserted through the circuit board 12 and heat dissipater 10, deformation of the barbs 44 creates a spring tension that holds the LED 20 tightly onto the heat dissipater 10. Preferred attachment loads of ten pounds per square inch (10 psi) or greater are easy to obtain in this manner, using thin spring steel or stainless steel material. However, in other modes, the tensioning portion may comprise an undulation 48 extending across each leg 36, 136 and/or a pair of spring arms 50 extending in opposite directions and transversely to the connecting portions 36, 136. Since the electrical leads 22 extend laterally from opposite extremities of the LED 20, the leads 22 overlie the traces 14 and extend beneath the spring arms 50 whereby the spring arms 50 apply a force urging the electrical leads 22 into engagement with the traces 14. The ancillary spring arms 50, which may be integral with any of the holding devices 24, 26, 28, 30 and 32, are used to connect or bias the electrical leads 22 to the traces 14 on the insulating layer 12. These added spring arms 50 might be insulated at their tips to permit contact with electronically energized leads 22. The advantage of spring loaded contact between the leads 22 and the circuit traces 14 is that contact pressure can be maintained under relatively harsh conditions including severe temperature cycling and vibration. The electrical contact may rely solely upon the biased engagement or an electrically conductive adhesive may be added where anticipated use would dictate it.

In order to facilitate the heat transfer between the LED 20 and the heat dissipater 10, a thermal coupling 52 might be sandwiched between the LED 20 and the heat dissipater 10 for conducting thermal energy between the LED 20 and the heat dissipater 10. The thermal coupling 52 comprises at least a thermally conductive material selected from a variety of filled or unfilled greases, gels or viscoelastic materials which reduce the thermal impedance of the interface to maximize heat transfer. In addition, the LED 20 may include a heat sink 54 with the thermal coupling 52 sandwiched between the heat sink 54 and the heat dissipater 10 for conducting thermal energy between the LED 20 and the heat dissipater 10.

Handling the holding devices 24, 26, 28, 30 and 32 and the associated LED 20 seperately prior to assembly of an LED 20 array is inconvenient, particularly if a large number of LED 20 are involved. A simple modification of the holding device 24, 26, 28, 30 or 32 to include an LED 20 retaining function is therefor recommended. Therefore, each of the holding devices 24, 26, 28, 30 and 32 also includes a retaining portion for retaining the LED 20 in the device 24, 26, 28, 30 and 32. The undulation 48 in each leg 36, 136 can also function as the retaining portion by being frictional engagement with the sides of the LED 20, i.e., the undulation 48 is gripping engagement with the sides of the LED 20 to frictional retain the LED 20 between the legs 36, 136 of the holding device 24, 26, 28, 30 or 32. In addition or alternatively, the retaining portion may comprise at least one tang 56 in gripping engagement with the LED 20, as only illustrated in FIGS. 5 and 7 but applicable to ass embodiments. The tang 56 may or may not be associated with the undulation 48, i.e., the tang 56 might be used without the undulation 48. As shown in FIGS. 5 and 7, the addition of LED 20 the holding tangs 56 allows the holding devices 24, 26, 28, 30 or 32 to be pre-assenbled with companion LEDs 20 so that auto-insertion machines or human aperators need only handle one pre-assembled component. For large LED 20 arrays, particularly those with a repeating geometric pattern, it may be expedient to form large retaining holding devices 24, 26, 28, 30 and 32. which can handle many LEDs 20. In principle, the operation and function of one or more large, multi-LED 20 retaining devices is similar to the single hloging devices 24, 26, 28, 30 or 32. That is, each LED 20 positijon in a multi-unit retaining holding device would exhibit its own spring force, which would be substancially de-coupled from the spring force applied to adjacent LEDs 20. Such a load sharing arrangement is necessary to ensure uniform pressure and clamping force at each LED 20, irrespective of slight differences in dimesion or orientation.

Installation of the holding device 24, 26, 28 and 32 is easy, and only requires a simple installation tool 58. The tool 58 in this example engages the locking barbs 44 of the holding device 24, 26, 28 and 32 and forces them through or into the appropriate opening 42 in the heat dissipater 10 thereby eliminating the need for a separate circuit board as distinguished from a coating or film, e.g., where the circuit traces 14 are printed as an integral part of the heat dissipater 10.

The locking barbs 44 are designed to provide a higher effective spring constant than the tensioning spring undulations 48 so that the latter is more easily deformed under installation. Once installed, the tensioning undulations 48 keep the LED 20 heat sink 54 in intimate contact with the heat dissipater 10 under virtually all conditions. Temperature cycling and temperature shock which adversely affect bonded joints have virtually no effect on a tensioned system provided by the present invention.

The invention also presents a method of assembling an electrically driven light emitting diode (LED) having electrical leads 22 over an electrically insulating layer 12 having circuit traces 14 disposed in predetermined spaced lengths over the insulating layer 12 and an electrically wherein the method comprises the steps of positioning at least one of the electrical leads 22 in electrical contact with one of the circuit traces 14 and is characterized interconnecting said LED (20) and said heat dissipater (10) with a device (24, 26, 28, 30 or 32) and reacting between said LED (20) and said heat dissipater (10) to urge at least a portion of said LED (20) into thermal engagement with said heat dissipater (10).

The thermally conductive heat dissipater 10 is sandwiched with the insulating layer 12 and at least a portion of the LED 20 is urged into thermal engagement with the heat dissipater 10 by applying a force urging the LED 20 into thermal engagement with the heat dissipater 10. Also included is the sandwiching of a thermal coupling 52 between the LED 20 and the heat dissipater 10 for conducting thermal energy between the LED 20 and the heat dissipater 10. Another inclusion is the sandwiching of a heat sink 54 with the thermal coupling 52 between the heat sink 54 and the heat dissipater 10 for conducting thermal energy between the LED 20 and the heat dissipater 10. Yet another step is the forming of a void 40 in the insulating layer 12 for surrounding each LED 20 and associated holding device 24, 26, 28, 30 or 32.

The method includes forming an opening 42 in the heat dissipater 10 and extending the holding device 24, 26, 28, 30 and 32 into the opening 42 for mechanical interlocking engagement with the heat dissipater 10. In a more specific sense, the heat dissipater 10 includes upper 16 and lower 18 surfaces and a plurality of such openings 42 are formed completely through the dissipater, thereby engaging the lower surface 18 of the dissipater with the holding device 24, 26, 28, 30 and 32. Alternatively, the openings 42 are formed partially into the dissipater 10 followed by the step of engaging the openings 42 between the upper 16 and lower 18 surfaces of the dissipater 10 with the holding device 24, 26, 28, 30 or 32.

Yet another alternative step in the method includes forming the heat dissipater 10 with at least one projection 46 and mechanically interlocking the projection 46 with the heat dissipater 10, as by peening or coining the projection over a hole in laterally extending legs 136 of the holding device 30.

Positioning the electrical leads 22 to extend laterally from opposite extremities of the LED 20 to overlie the traces 14, facilitates the step of applying a force urging the LED 20 into thermal engagement with the heat dissipater 10 and the electrical leads 22 thereof into engagement with the traces 14.

As alluded to above, the method includes the step of forming the holding device 24, 26, 28, 30 or 32 in a generally U-shaped cross section to define a base overlying the LED 20 and a pair of legs 36, 136 depending therefrom to engage the heat dissipater 10. Additionally, the forming of the holding device includes forming a hole 38 in the base and protruding 39 the LED 20 through the hole 38 to emit light. Also included is the retaining of the LED 20 in the holding device 24, 26, 28, 30 and 32. Further to the assembly method is the forming of a retaining portion in each of the legs 36, 136 for retaining the LED 20 in the holding device 24, 26, 28, 30 and/or 32. The retaining portion may be the undulations 48 and/or the tangs 56. As stated above, the forming of a retaining portion in each of the legs 36, 136 allows the holding devices 24, 26, 28, 30 and 32 to be pre-assembled with companion LEDs 20 so that auto-insertion machines or human operators need only handle one pre-assembled component.

As is clear from the above description, the method includes forming a void 40 in the insulating layer 12 for surrounding the LED 20 and the legs 36, 136 of each associated holding device 24, 26, 28, 30 and 32.

As will be appreciated by those skilled in the art, the various features of the various embodiments may be variously combined into one holding device, e.g., the spring arms 50, the tangs 56, the undulations 48, the barbs 44 or projections 46, etc. may be combined in total or in numerous sub-combinations depending upon the application.

Obviously, many modifications and variations of the present invention are possible in light of the above teachings. The invention may be practiced otherwise than as specifically described within the scope of the appended claims, wherein that which is prior art is antecedent to the novelty set forth in the "characterized by" clause. The novelty is meant to be particularly and distinctly recited in the "characterized by" clause whereas the antecedent recitations merely set forth the old and well-known combination in which the invention resides. These antecedent recitations should be interpreted to cover any combination in which the incentive novelty exercises its utility. In addition, the reference numerals in the claims are merely for convenience and are not to be read in any way as limiting.

What is claimed is:

1. An electrically driven light emitting diode (LED) assembly comprising;
    an electrically and thermally conductive heat dissipater (10),
    an electrically insulating layer (12) over said heat dissipater (10),
    circuit traces (14) disposed in predetermined spaced lengths over said layer (12) to prevent electrical conduction between said traces (14) and said heat dissipater (10),
    a plurality of light emitting diodes (LEDs) (20) each having at least one electrical lead (22) for electrical contact with said traces (14) for powering said LEDs (20),
    an independent holding device (24, 26, 28, 30 or 32) holding each of said LEDs (20) in a predetermined position on said insulating layer (12) with at least one of said electrical leads (22) thereof in electrical engagement with one of said traces (14), said device (24, 26, 28, 30 and 32) including a holding portion (34, 134) for engaging each of said LEDs (20) and a connecting portion (36, 136) connected to said heat dissipater (10) for reacting between each of said LEDs (20) and said heat dissipater (10) to urge said holding portion into engagement with each of said LEDs (20) to urge at least a portion of each of said LEDs (20) into thermal engagement with said heat dissipater (10).

2. An assembly as set forth in claim 1 including a thermal coupling (52) sandwiched between said LED (20) and said heat dissipater (10) for conducting thermal energy between said LED (20) and said heat dissipater (10).

3. An assembly as set forth in claim 2 wherein said LED (20) includes a heat sink (54) and said thermal coupling (52) is sandwiched between said heat sink (54) and said heat dissipater (10) for conducting thermal energy between said LED (20) and said heat dissipater (10).

4. An assembly as set forth in claim 1 wherein said insulating layer (12) includes a void (40) surrounding each LED (20) and associated holding device (24, 26, 28, 30 or 32).

5. An assembly as set forth in claim 1 wherein each of said holding devices (24, 26, 28, 30 and 32) includes a tensioning portion for applying a force urging said LED (20) into thermal engagement with said heat dissipater (10).

6. An assembly as set forth in claim 1 wherein each of said holding devices (24, 26, 28, 30 and 32) includes a retaining portion for retaining said LED (20) in said device (24, 26, 28, 30 or 32).

7. An assembly as set forth in claim 6 wherein said retaining portion includes at least one tang (56) in mechanical gripping engagement with said LED (20).

8. An assembly as set forth in claim 1 wherein said heat dissipater (10) presents at least one opening (42) and said connecting portion (36) extends into said opening (42) for mechanical interlocking engagement with said heat dissipater (10).

9. An assembly as set forth in claim 8 wherein said connecting portion (36) includes a barb (44) in gripping engagement with said heat dissipater (10).

10. An assembly as set forth in claim 9 wherein said heat dissipater (10) includes upper (16) and lower (18) surfaces.

11. An assembly as set forth in claim 10 wherein said opening (42) extends completely through said heat dissipater (10) and said barb (44) engages said lower surface (18) thereof.

12. An assembly as set forth in claim 10 wherein said opening (42) extends at least partially into said dissipater (10) and said barb (44) engages said opening (42) between said upper (16) and lower (18) surfaces.

13. An assembly as set forth in claim 1 wherein said heat dissipater (10) presents at least one projection (46) for retaining said connecting portion (136) to mechanically interlock with said heat dissipater (10).

14. An assembly as set forth in claim 1 wherein said electrical leads (22) extend laterally from opposite extremities of said LED (20) and overlie said traces (14).

15. An assembly as set forth in claim 14 wherein each of said holding devices (24, 26, 28, 30 and 32) includes a tensioning portion for applying a force urging said LED (20) into thermal engagement with said heat dissipater (10) and said electrical leads (22) thereof into engagement with said traces (14).

16. An assembly as set forth in claim 1 wherein said holding device (24, 26, 28, 30 and 32) includes a pair of said connecting portions (36, 136) extending in spaced relationship to one another.

17. An assembly as set forth in claim 16 wherein said holding device (26, 28, 30 or 32) includes a pair of spring arms (50) extending in opposite directions and transversely to said connecting portions (36, 136).

18. An assembly as set forth in claim 17 wherein said electrical leads (22) extend laterally from opposite extremities of said LED (20) and overlie said traces (14) and said spring arms (50) apply a force urging said electrical leads (22) thereof into engagement with said traces (14).

19. An assembly as set forth in claim 16 wherein each of said holding devices (24, 26, 28, 30 and 32) is generally U-shaped as viewed in cross section to define a base overlying said LED (20) and a pair of legs depending therefrom to define a pair of said connecting portions (36, 136).

20. An assembly as set forth in claim 19 wherein said base defines a hole (38) and said LED (20) protrudes (39) through said hole (38) to emit light.

21. An assembly as set forth in claim 20 wherein each of said legs (36, 136) includes a retaining portion for retaining said LED (20) in said holding device (24, 26, 28, 30 or 32).

22. An assembly as set forth in claim 21 wherein said retaining portion comprises at least one tang (56) in gripping engagement with said LED (20).

23. An assembly as set forth in claim 21 wherein said retaining portion comprises an undulation (48) in gripping engagement with said LED (20) to frictionally retain said LED (20) between said legs (36, 136) of said holding device (24, 26, 28, 30 and 32).

24. An assembly as set forth in claim 21 wherein said insulating layer (12) includes a void (40) surrounding each LED (20) and said legs (36) of each associated holding device (24, 26, 28 and 32).

25. An assembly as set forth in claim 24 wherein said heat dissipater (10) includes a pair of spaced openings (42) for each of said holding devices (24, 26, 28 and 32) and said legs (36) of each of said holding devices (24, 26, 28 and 30) extend into a pair of said openings (42).

26. An assembly as set forth in claim 24 wherein said electrical leads (22) extend laterally from opposite extremities of said LED (20) and transversely to said legs (36, 136) to overlie said traces (14).

27. An assembly as set forth in claim 26 wherein each of said holding devices (24, 26, 28, 30 and 32) includes a tensioning portion for applying a force urging said LED (20) into thermal engagement with said heat dissipater (10) and said electrical leads (22) thereof into engagement with said traces (14).

28. An assembly as set forth in claim 19 wherein said heat dissipater (10) presents at least one projection (46) for retaining said connecting portion to mechanically interlock with said heat dissipater (10).

29. An electrically driven light emitting diode (LED) assembly comprising;

an electrically and thermally conductive heat dissipater (10), an electrically insulating layer (12) over said heat dissipater (10), circuit traces (14) disposed in predetermined spaced lengths over said layer (12) to prevent electrical conduction between said traces (14) and said heat dissipater (10), a plurality of light emitting diodes (20) each having electrical leads (22) extending laterally from opposite extremities of said LED (20) to overlie said traces (14) for electrical contact with said traces (14) for powering said LED (20), an independent and generally U-shaped holding device (24, 26, 28, 30 and 32) as viewed in cross section to define a base overlying said LED (20) and a pair of legs (36, 136) depending therefrom and transversely to said electrical leads (22), said base defines a hole (38) and said LED (20) protrudes (39) through said hole (38) to emit light, said insulating layer (12) including a void (40) surrounding each LED (20), and each of said holding devices (24, 26, 28, 30 and 32) includes a tensioning portion (44 or 48) for applying a force urging said LED (20) through said void (40) and into thermal engagement with said heat dissipater (10) and said electrical leads (22) thereof into engagement with said traces (14).

30. A method of assembling an electrically driven light emitting diode (LED) having electrical leads (22) over an electrically insulating layer (12) having circuit traces (14) disposed in predetermined spaced lengths over said insulating layer (12), the method comprising the steps of:

overlaying an electrically and thermally conductive heat dissipater (10) with the insulating layer (12), positioning the electrical leads (22) in electrical contact with the circuit traces (14), and urging at least a portion of the LED (20) into thermal engagement with the heat dissipater (10), mechanically holding the LED (20) in a predetermined position on the insulating layer (12) with the electrical leads (22) thereof in electrical engagement with the traces (14).

31. A method as set forth in claim 30 including sandwiching a thermal coupling (52) between the LED (20) and the heat dissipater (10) for conducting thermal energy between the LED (20) and the heat dissipater (10).

32. A method as set forth in claim 31 including disposing a heat sink (54) and the thermal coupling (52) between the heat sink (54) and the heat dissipater (10) for conducting thermal energy between the LED (20) and the heat dissipater (10).

33. A method as set forth in claim 31 including forming an opening (42) in the heat dissipater (10) and extending a holding device (24, 26, 28 and 32) into the opening (42) for reacting engagement with the heat dissipater (10).

34. A method as set forth in claim 33 including employing said heat dissipater (10) having upper (16) and lower 18 surfaces.

35. A method as set forth in claim 34 including forming the opening (42) completely through the heat dissipater (10) and engaging the lower surface (18) of the heat dissipater (10) with the holding device (24, 26 and 28).

36. A method as set forth in claim 35 including forming the opening (42) at least partially into the heat dissipater (10) and engaging the opening (42) between the upper (16) and lower (18) surfaces of the heat dissipater (10) with the holding device (24, 26 and 32).

37. A method as set forth in claim 30 including applying a force urging the LED (20) into thermal engagement with the heat dissipater (10).

38. A method as set forth in claim 30 including forming a void (40) in the insulating layer (12) surrounding each LED (20) with a holding device (24, 26, 28, 30 and 32).

39. A method as set forth in claim 38 including retaining the LED (20) in the holding device (24, 26, 28, 30 or 32).

40. A method as set forth in claim 30 including forming the heat dissipater (10) with at least one projection (46) and mechanically interlocking the projection (46) with the heat dissipater (10).

41. A method as set forth in claim 30 including positioning the electrical leads (22) extending laterally from opposite extremities of the LED (20) to overlie the traces (14).

42. A method as set forth in claim 41 including applying a force urging the LED (20) into thermal engagement with the heat dissipater (10) and the electrical leads (22) thereof into engagement with the traces (14).

43. A method as set forth in claim 42 including surrounding each generally U-shaped cross section to define a base overlying the LED (20) and a pair of legs (36, 136) depending therefrom to engage the heat dissipater (10).

44. A method as set forth in claim 43 including forming a hole (38) in the base and protruding (39) the LED (20) through the hole (38) to emit light.

45. A method as set forth in claim 44 including forming a retaining portion (56 or 48) in each of the legs for retaining the LED (20) in the holding device (24, 26, 28, 30 and 32).

46. A method as set forth in claim 45 including forming a void (40) in the insulating layer (12) surrounding the LED (20) and the legs (36, 136) of each associated holding device (24, 26, 28, 30 and 32).

47. A method of assembling an electrically driven light emitting diode (LED) having laterally extending electrical leads (22) over an electrically insulating layer (12) having circuit traces (14) disposed in predetermined spaced lengths over said insulating layer (12) and an electrically and thermally conductive heat dissipater (10), the method comprising the steps of; retaining the LED (20) in a U-shaped holding device (24, 26, 28, 30 or 32) having a base overlying the LED (20) and a pair of legs (36, 136) depending therefrom, and connecting the legs (36, 136) of the holding device (24, 26, 28, 30 or 32) to the heat dissipater (10) to position the LED (20) with the electrical leads (22) thereof forced into electrical engagement with the traces (14).

* * * * *

UNITED STATES PATENT AND TRADEMARK OFFICE
CERTIFICATE OF CORRECTION

PATENT NO. : 6,582,100 B1
DATED : June 24, 2003
INVENTOR(S) : Peter A. Hochstein and Gregg K. Reber It is certified that error appears in the above-identified patent and that said Letters Patent is hereby corrected as shown below:

Column 8,
Line 17, delete "LEDs" and replace with -- LED --.
Line 25, insert -- at least --, after "and".

Column 11,
Line 4, delete "24, 26, and 28" and replace with -- 24 and 26 --.
Line 5, delete "35" and replace with -- 34 --.
Line 9, delete "24, 26 and 32" and replace with -- 28 and 32 --.

Column 12,
Line 2, after "each", insert -- LED with a holding device and forming each holding device (24, 26, 28, 30 and 32) in a --.

Signed and Sealed this

Thirtieth Day of August, 2005

JON W. DUDAS
*Director of the United States Patent and Trademark Office*